United States Patent [19]

Smith et al.

[11] Patent Number: 4,850,896
[45] Date of Patent: Jul. 25, 1989

[54] COUPLING ARRANGEMENTS

[75] Inventors: Michael S. Smith, Watford; Gurnam S. Bharj, Harrow, both of England

[73] Assignee: Smiths Industries Public Limited Company, London, England

[21] Appl. No.: 200,866

[22] Filed: Jun. 1, 1988

[30] Foreign Application Priority Data

Jun. 27, 1987 [GB] United Kingdom ............. 8715164

[51] Int. Cl.<sup>4</sup> ............................................. H01R 3/00
[52] U.S. Cl. .................................... 439/489; 439/362; 411/14; 403/27
[58] Field of Search ................................ 439/359–365, 439/312, 315, 488, 489; 411/8–14; 403/27

[56] References Cited

U.S. PATENT DOCUMENTS

| 3,555,491 | 3/1969 | Moss | 439/363 |
| 3,872,734 | 3/1975 | Riethmeier | 74/89.15 |
| 4,290,662 | 9/1981 | Storcel | 439/489 |
| 4,406,329 | 3/1985 | Roake | 29/747 |
| 4,629,351 | 12/1986 | Kato et al. | 439/488 |

FOREIGN PATENT DOCUMENTS 2052179 1/1981 United Kingdom .

Primary Examiner—Neil Abrams
Assistant Examiner—Khiem Nguyen
Attorney, Agent, or Firm—Pollock, Vande Sande & Priddy

[57] ABSTRACT

A coupling for making electrical connection of an avionics box and for retaining it in a rack has a rotatable jackscrew, by which cooperating parts of an electrical connector on the box and the rack can be drawn together. The jackscrew has a knob at one end with an indicator button which is pulled into the knob by a mechanical linkage when the two parts of the connector are fully mated. The linkage includes a sleeve which embraces the jackscrew and which is pushed towards the knob against a spring when the connector is mated. A ratchet mechansim limits the torque applied by the jackscrew. Ball catches engage asymmetric grooves on the sleeve to make it more difficult to unfasten the jackscrew than to fasten it.

13 Claims, 4 Drawing Sheets

COUPLING ARRANGEMENTS

BACKGROUND OF THE INVENTION

This invention relates to coupling arrangements.

In some couplings it is desirable for a visual indication to be produced, to show when the parts of the coupling are fully mated together or when they are not fully mated. One example of this is with electrical connector assemblies where incomplete mating may prevent electrical connection, or may lead to increased connector resistance, or may prevent mating of other components mounted with the respective parts of the connector assembly.

Where one part of the coupling supports a locking ring that engages the other part of the coupling, and the locking ring is rotatable through less than one full turn, then an indication of full mating can be readily provided by observation of the orientation of the locking ring which can be suitably marked. However, if, for example, a jackscrew is used to draw the two parts of the coupling together, this will generally need to be rotated through more than one full turn, and its angular orientation cannot therefore be used to provide an indication of mating. A ratchet or slipping clutch may be used to limit torque applied by the coupling. When full mating has been achieved this can be felt by clicking of the ratchet or slipping of the clutch. However, the same effect will also be produced before full mating if the maximum torque of the ratchet or clutch is exceeded for some other reason, such as because of damage to parts of the coupling preventing them being drawn fully together.

BRIEF SUMMARY OF THE INVENTION

It is an object of the present invention to provided a coupling arrangement and an electrical connector assembly including such a coupling arrangement which can provide a reliable visual indication of full mating of the parts of the coupling arrangement.

According to one aspect of the present invention, there is provided a coupling arrangement having two parts arranged to be drawn together into a mating relationship by actuation of a rotatable jackscrew, the coupling arrangement including a mechanical linkage extending from a first location between the two parts of the coupling to a remote location, the mechanical linkage being coupled at the remote location to visual indicator means, and the mechanical linkage being arranged to be displaced at the first location when the two parts of the coupling are drawn together into a full mating relationship and thereby effect change of the visual indicator means so as to provide a visual indication of mating.

The two parts are preferably electrical connector components that can be mated with one another to establish electrical interconnection between the components. The mechanical linkage may include a rigid elongate member that is displaced along its length when the two parts of the coupling are drawn together. The elongate member may include a sleeve member which preferably embraces the jackscrew along a part at least of its length. A spring may be arranged to urge the sleeve towards the first location and the mechanical linkage may include a pivoted lever coupled with the visual indicator means. The visual indicator may include a button with a peripheral surface that is exposed to view when the two parts of the coupling are not fully mated. The button may be urged by a spring to a position in which the peripheral surface is exposed to view. The jackscrew preferably has a knob by which it can be rotated, the visual indicator means being mounted in the knob.

The coupling arrangement preferably includes means for limiting torque applied by the jackscrew which may include a ratchet mechanism. The jackscrew may be arranged such that a greater force is required to unfasten the jackscrew than to fasten it. The coupling arrangement may include a sprocket mechanism having grooves shaped such that a greater force is required to unfasten the jackscrew than to fasten it. The grooves may be provided on the sleeve member.

According to another aspect of the present invention, there is provided an electrical connector assembly including a coupling arrangement according to the above one aspect of the present invention.

An electrical connector assembly for an avionics box, including a coupling according to the present invention, will now be described, by way of example, with reference to the accompanying drawings.

DESCRIPTION OF PREFERRED EMBODIMENT

Figure 1:
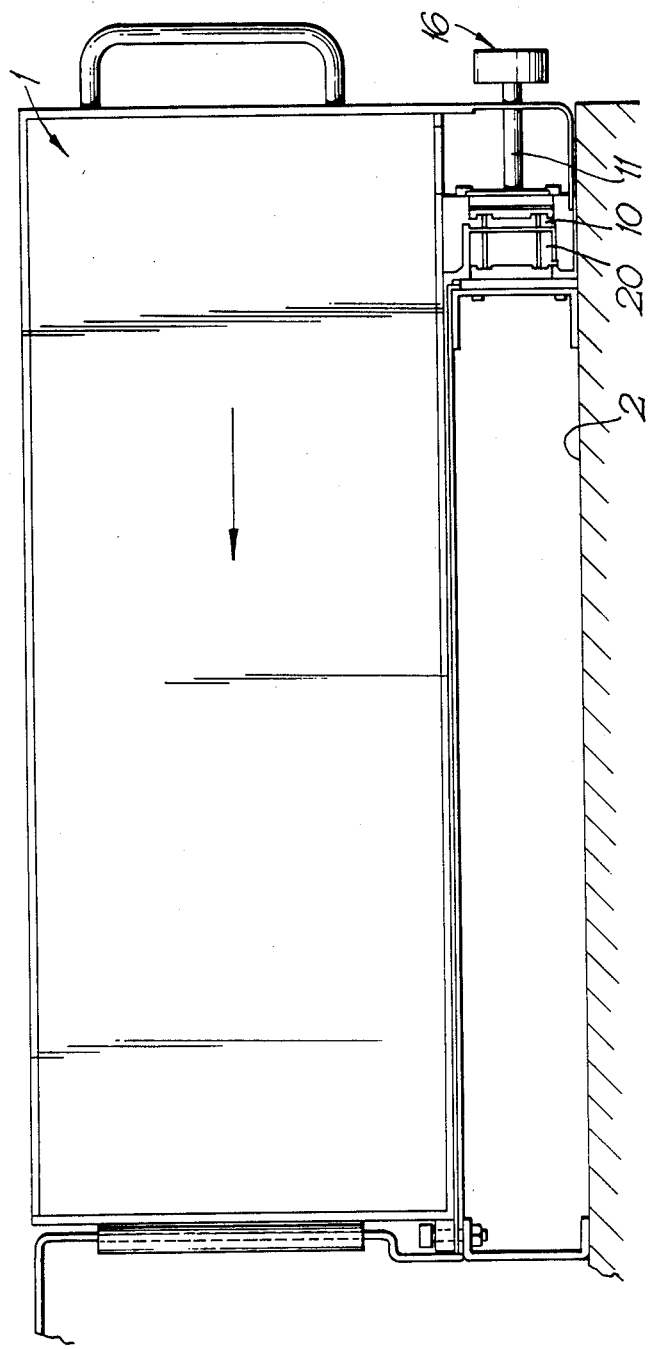
FIG. 1 is a schematic side elevation of the avionics box.

With reference first to FIG. 1, there is shown, in a highly simplified form, an avionics box 1, mounted in a rack 2. Electrical interconnection of the box 1 with other equipment (not shown) is made by means of an electrical connector assembly having one part 10 mounted on the bottom of the box and a cooperating part 20 mounted on the rack. The two parts 10 and 20 of the connector assembly are arranged such that, when the box 1 is slid into the rack 2, along its length, in the direction indicated by the arrow, the two parts of connector assembly come into mating engagement with one another. A jackscrew 11 is mounted with that part 10 of the connector assembly on the box 1 and is engageable, at one end, with the other part 20 of the connector assembly on the rack 2 so as to draw the two parts of the connector assembly together and retain the box in the rack.

Figure 2:
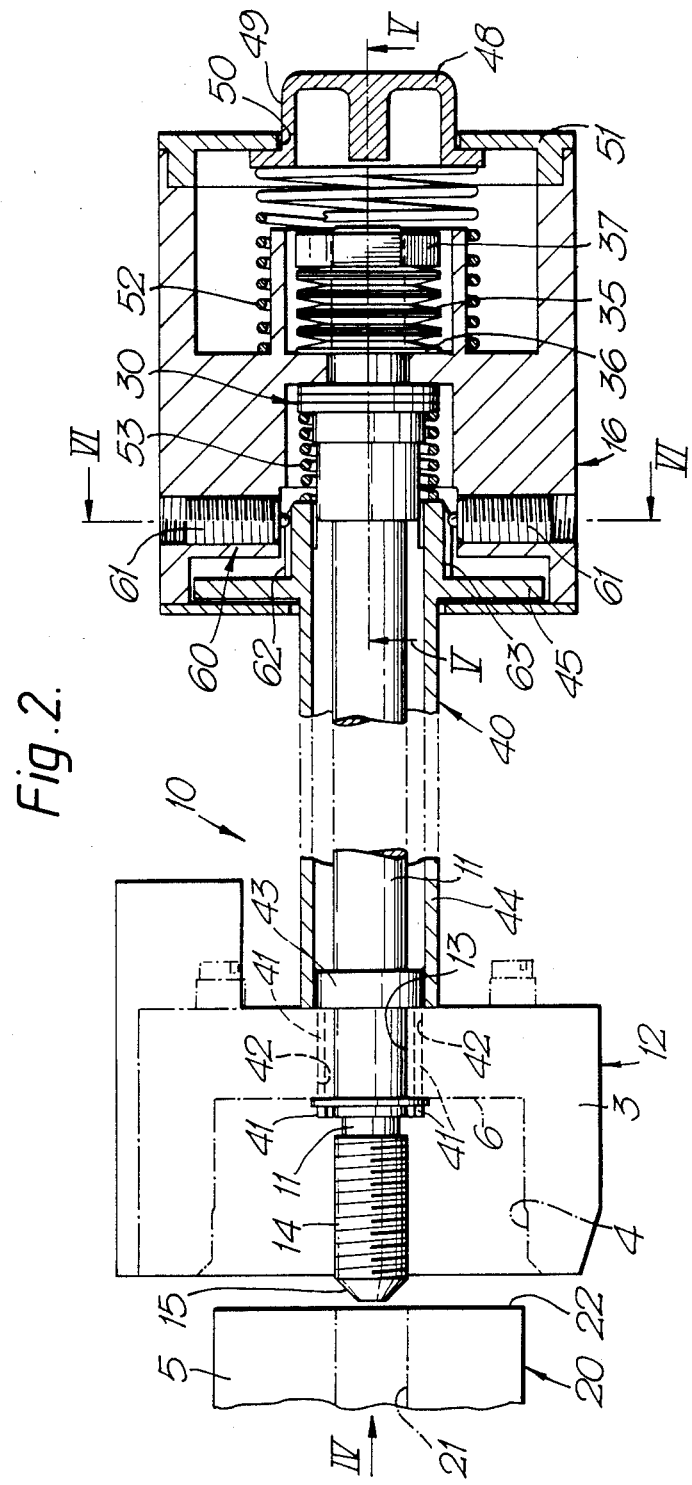
FIG. 2 is an enlarged sectional elevation of the coupling arrangement in an unmated condition.
Figure 3:
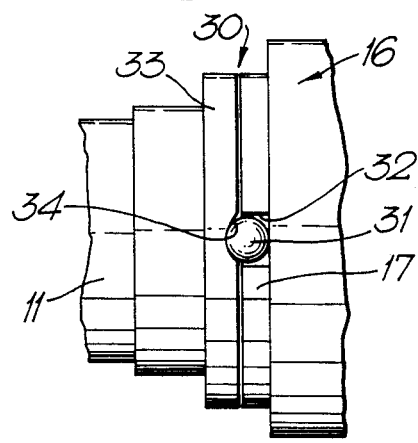
FIG. 3 shows a part of the coupling in greater detail.

With reference now also to FIGS. 2 and 3, one part of the connector assembly 10 comprises the jackscrew 11 and a conventional multi-pin electrical connector component 12 that is pluggable into the rack-mounted part 20 of the connector assembly. The connector component 12 has a housing 3 with a central rectangular recess 4 which is shaped to receive a rectangular projection 5 on the rack-mounted part 20 of the connector assembly. An aperture 13 is formed centrally in the rear wall 6 of the recess 4, through which projects the forward end 14 of the jackscrew 11. The forward end 14 is externally threaded with a tapered tip 15 that projects just beyond the forward edge of the connector 12. The jackscrew 11 is free to rotate in the aperture 13, but is prevented from forward or rearward displacement relative to the connector 12.

At its other, rear end, the jackscrew 11 is retained with a knob 16 by which it can be rotated via a ratchet mechanism indicated generally by the numeral 30. The ratchet 30, which is shown in greater detail in FIG. 3, may be of conventional construction and comprise four balls 31 located equally spaced around the jackscrew in slots 32 formed in a ring 17 fixed with the knob 16 and rotated with it. A cam plate 33 is fixed with the jackscrew 11 and has four convex recesses 34 which engage respective ones of the balls 31. A set of Belleville washers 35, or other spring arrangement, pulls the ratchet mechanism together so that, when the knob 16 is rotated, it rotates the jackscrew through engagement of the cam plate 33 with the balls 31. If rotation of the jackscrew 11 is impeded, the cam plate 33 rides up over the balls 31, against the action of the Belleville washers 35, once a preset torque is exceeded, thereby allowing the knob 16 to be rotated relative to the jackscrew. The Belleville washers 35 are located between a shoulder 36 on the knob 16 and a nut 37 screwed on the rear end of the jackscrew 11. By screwing the nut 37 forwardly or rearwardly on the jackscrew, the maximum torque with which the jackscrew can be rotated is increased or decreased respectively.

Figure 4:
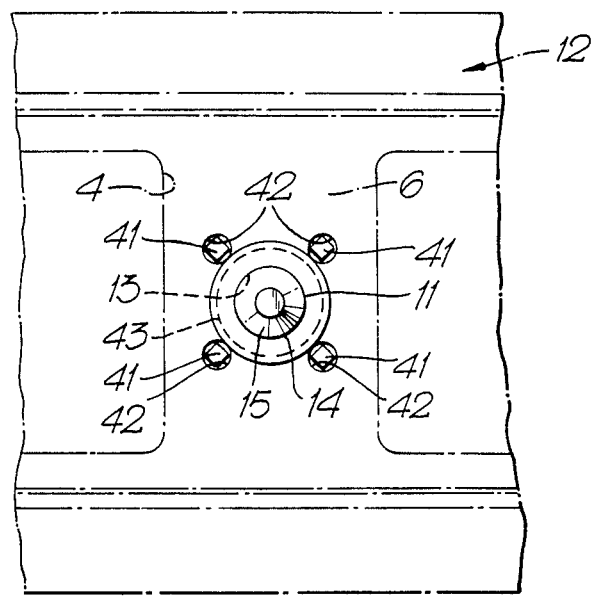
FIG. 4 is an end view of the coupling along the arrow IV of FIG. 2.
Figure 5:
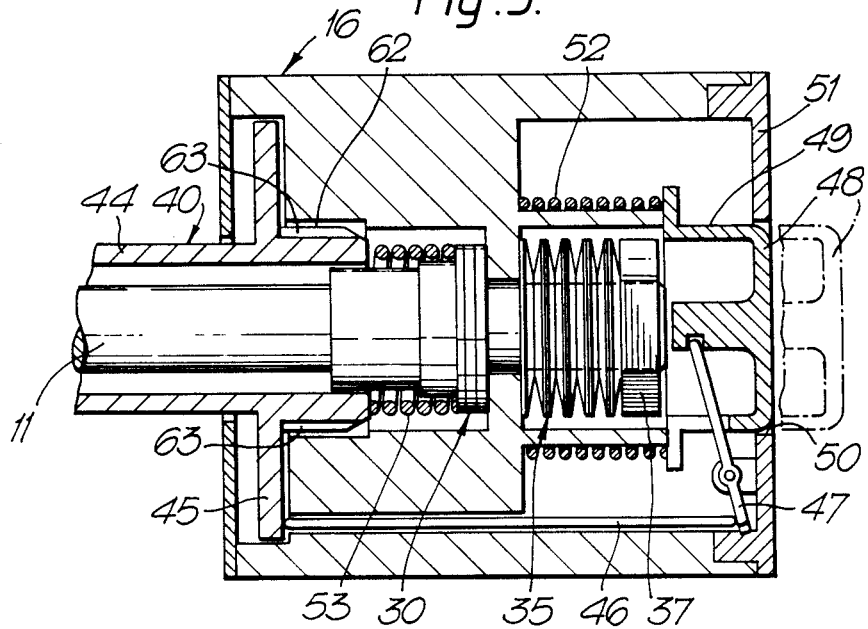
FIG. 5 shows a part of the coupling in a mated condition, as a sectional view in a plane normal to that of FIG. 2, indicated by the line V—V.

With reference now also to FIGS. 4 and 5, a visual indication of full mating of the two connector assemblies 10 and 20 is provided in the knob 16 by means of a mechanical linkage indicated generally by numeral 40. The mechanical linkage 40, includes four parallel pegs 41 that extend through respective holes 42 in the rear wall 6 of the housing 3 of the connector 12, equally spaced around the central aperture 13, the pegs projecting a short distance of about 2.5 mm forwardly from the rear wall at a first location between the two parts 10 and 20 of the connector assembly. Where the rear end of the pegs 41 emerge from the holes 42, they are secured into an annular flange 43. The flange 43 embraces the jackscrew 11 and is slidable along its length, the outer edge of the flange being welded into one end of a rigid elongate sleeve 44 that extends axially along the jackscrew to the knob 16. Close to its other, rear end, the sleeve 44 is formed with a radially projecting flange 45, the rear surface of which contacts the forward end of an actuating rod 46 (FIG. 5) that extends towards the rear of the knob 16. The rear end of the actuating rod 46 engages one end of a pivoted lever 47, the other end of which is coupled to an indicator button 48 at a location remote from the first location. The indicator button 48 is of cylindrical shape with a brightly coloured peripheral curved surface 49. The button 48 is mounted behind of a central aperture 50 in a flat, circular end cap 51 of the knob. The button 48 is urged outwardly of the knob by a helical spring 52 so that, in a first, outer position, the coloured peripheral surface 49 of the button is readily visible, as shown in FIG. 2. The action of the spring 52 also urge the actuating rod 46, the sleeve 44 and the pegs 41 forwardly to a first position. The force with which the sleeve 44 is urged forwardly is increased by an additional helical spring 53 within the knob 16 which engages directly the rear end of the sleeve.

Figure 6:
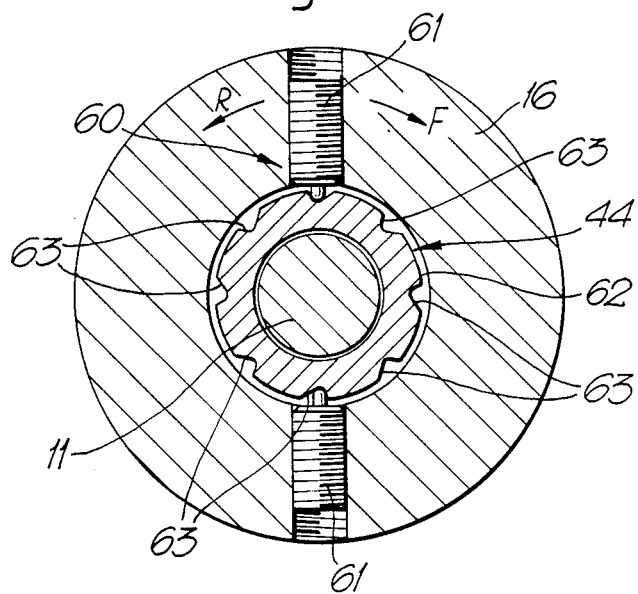
FIG. 6 is a sectional view of a part of the coupling along the line VI—VI of FIG. 2.

With reference now also to FIG. 6, the knob 16 also includes a sprocket mechanism, indicated generally by the numeral 60, which makes it more difficult for the jackscrew to be released (that is, rotated anticlockwise) than to be tightened. The purpose of this is to reduce the risk of vibration releasing the jackscrew. The mechanism 60 includes two spring-loaded ball catches 61 that project radially inwardly of the knob 16 to engage the outer surface 62 at the rear of the sleeve 44. This outer surface 62 is generally circular, being formed with six assymmetrical grooves 63 equally disposed around the surface. One side of each groove 63 has a shallower angle than the opposite side so that the ball catches 61 will ride out of the grooves more easily in one direction than the other. In particular, it will be seen that the knob 16 can be rotated relative to the sleeve 44 more easily in the fastening direction, indicated by the arrow marked F, than in the release direction, indicated by the arrow marked R.

In operation, the box 1 is slid forwardly until the jackscrew 11 contacts a threaded opening 21 in the rack-mounted connector assembly 20. In this unmated position, the springs 52 and 53 displace the pegs 41 forwardly and the indicator button 48 rearwardly so that the coloured periphery 49 is clearly visible (as shown in FIG. 2) and it is readily apparent that full mating of the two parts 10 and 20 of the connector assembly has not been achieved. The knob 16 is then twisted in a clockwise sense to draw the box 1 and its part 10 of the connector assembly forwardly towards the rack mounted part 20 of the connector assembly. As this happens, the ball catches 61 ride into and out of the grooves 63 relatively easily.

When the two parts 10 and 20 of the connector assembly are drawn into a fully mated condition, the floor 22 of the rack mounted part of the connector assembly will engage the forward end of the pegs 41 and push them rearwardly, towards the rear wall 6 of the recess 4 in the connector housing 3. Rearward movement of the pegs 41 causes rearward movement of the sleeve 44, to its second position, and rearward movement of the actuating rod 46 along its length. This causes anticlockwise rotation of the lever 47 which pulls the indicator button 48 forwardly into the knob 16 against the action of the spring 52, to a second position, so that its coloured surface 49 is not longer visible (as shown in FIG. 5) and it has changed its appearance.

If the knob 16 is twisted further, so that a torque is applied exceeding that preset by the Belleville washers 35, the cam plate 33 will ride up over the ratchet balls 31 giving a change in resistance to rotation of the knob and a click sound, both of which will be readily apparent to the user. This will prevent excess torque being applied by the jackscrew.

Once fastened, the sprocket mechanism 60 is arranged such that twice the force has to be applied to release the jackscrew as to fasten it, thereby reducing the risk of the jackscrew being released.

If, because of damage to a component or for some other reason, full mating of the two parts of the connector assembly is prevented, the ratchet mechanism 30 will prevent excess torque being applied and the indicator button 48 will remain out showing that mating has not been fully achieved.

It will be appreciated that various modifications could be made to the invention. For example, other mechanical linkages could be used instead of the sleeve, rod and lever described above. Other forms of visual indicator could be used instead of a member displaced longitudinally of the jackscrew.

What we claim is:

1. A coupling arrangement of the kind having two parts arranged to be drawn together into a mating relationship, one of said parts having a jackscrew in the form of an elongate rod that is rotatable about its axis, said jackscrew being screw threaded at one end to engage the other of said parts and at its opposite end remote from the one end being provided with a knob by which the jackscrew can be rotated to draw the two parts together, the improvement wherein the said one part includes a mechanical linkage which extends in parallel with said jackscrew from a first location between the two parts of the coupling to said knob, visual indicator means in said knob, means coupling the mechanical linkage to said visual indicator means, and wherein the mechanical linkage is displaced at said first location when the two parts of the coupling are drawn together into a full mating relationship such as thereby to effect change in position of the visual indicator means so as to provide a visual indication of mating.

2. A coupling arrangement according to claim 1, wherein the said two parts are electrical connector components, and wherein the connector components are mateable with one another to establish electrical interconnection between the said components.

3. A coupling arrangement according to claim 1, wherein the mechanical linkage includes a rigid elongate sleeve, and wherein said sleeve embraces the jackscrew along a part at least of its length.

4. A coupling arrangement according to claim 3, wherein the arrangement includes a spring and wherein the spring urges the sleeve towards the said first location.

5. A coupling arrangement according to claim 1, wherein the mechanical linkage includes a pivoted lever, and wherein the pivoted level is coupled with the said visual indicator means.

6. A coupling arrangement according to claim 1, wherein the said visual indicator means includes a button, said button having a peripheral surface, and wherein the coupling arrangement includes a spring, said spring urging the button to a position in which the peripheral surface is exposed to view when the two parts of the coupling arrangement are not fully mated.

7. A coupling arrangement according to claim 1, including a ratchet mechanism and means coupling said ratchet mechanism to said jackscrew such as to limit the torque applied by the jackscrew.

8. A coupling arrangement according to claim 1, including a sprocket mechanism and means coupling said sprocket mechanism to said jackscrew, wherein the sprocket mechanism has grooves shaped such that a greater force is required to unfasten the jackscrew than to fasten it.

9. A coupling arrangement according to claim 2, wherein the said visual indicator means includes a button, said button having a peripheral surface, and wherein the coupling arrangement includes a spring, said spring urging the button to a position in which the peripheral surface is exposed to view when the two parts of the coupling arrangement are not fully mated.

10. A coupling arrangement according to claim 3, wherein the said visual indicator means includes a button, said button having a peripheral surface, and wherein the coupling arrangement includes a spring, said spring urging the button to a position in which the peripheral surface is exposed to view when the two parts of the coupling arrangement are not fully mated.

11. A coupling arrangement according to claim 4, wherein the said visual indicator means includes a button, said button having a peripheral surface, and wherein the coupling arrangement includes a spring, said spring urging the button to a position in which the peripheral surface is exposed to view when the two parts of the coupling arrangement are not fully mated.

12. A coupling arrangement according to claim 5, wherein the said visual indicator means includes a button, said button having a peripheral surface, and wherein the coupling arrangement includes a spring, said spring urging the button to a position in which the peripheral surface is exposed to view when the two parts of the coupling arrangement are not fully mated.

13. An electrical connector assembly comprising: two electrical connector parts that are mateable with one another; a rotatable jackscrew in the form of an elongate rod mounted with one of said parts, said jackscrew being rotatable about its axis and screw threaded at one end to engage the other of said parts such that the two parts can be drawn together into a mating relationship by rotation of the jackscrew; a rigid elongate sleeve, said sleeve embracing the jackscrew along a part at least of its length; a mechanical member at one end of the sleeve, said mechanical member extending between the two connector parts such that the sleeve is displaced from a first position to a second position when the two parts are drawn together into a full mating relationship; a knob at the other end of the jackscrew by which the jackscrew can be rotated; visual indicator means mounted on the knob; means coupling the visual indicator means to sleeve such that the visual indicator means is displaced from a first position to a second position by the sleeve to provide a visual indication of mating; a spring; and means mounting the spring to urge the sleeve and the visual indicator means to their first position until full mating occurs.

* * * * *